(12) United States Patent
Abe

(10) Patent No.: US 10,957,831 B2
(45) Date of Patent: Mar. 23, 2021

(54) LIGHT EMITTING DEVICE AND METHOD OF MANUFACTURING THE SAME, AND DISPLAY DEVICE

(71) Applicant: NICHIA CORPORATION, Anan (JP)

(72) Inventor: Koji Abe, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/656,791

(22) Filed: Oct. 18, 2019

(65) Prior Publication Data
US 2020/0052172 A1 Feb. 13, 2020

Related U.S. Application Data

(62) Division of application No. 15/649,149, filed on Jul. 13, 2017, now Pat. No. 10,490,717.

(30) Foreign Application Priority Data

Jul. 13, 2016 (JP) .................................. 2016-138417

(51) Int. Cl.
*H01L 33/60* (2010.01)
*H01L 33/50* (2010.01)
(Continued)

(52) U.S. Cl.
CPC .............. *H01L 33/60* (2013.01); *G02B 5/285* (2013.01); *G02B 5/286* (2013.01); *H01L 22/20* (2013.01); *H01L 33/505* (2013.01); *H01L 33/54* (2013.01); *G02B 5/201* (2013.01); *G02B 2207/101* (2013.01); *H01L 33/507* (2013.01); *H01L 33/62* (2013.01); *H01L 2224/48091* (2013.01); *H01L 2224/48247* (2013.01); *H01L 2224/48257* (2013.01); *H01L 2924/181* (2013.01); *H01L 2933/005* (2013.01); *H01L 2933/0041* (2013.01); *H01L 2933/0058* (2013.01); *H01L 2933/0066* (2013.01); *H01L 2933/0091* (2013.01)

(58) Field of Classification Search
CPC ....... H01L 33/60; H01L 33/507; H01L 33/54; H01L 22/20
See application file for complete search history.

(56) References Cited

U.S. PATENT DOCUMENTS

| 6,049,419 A | 4/2000 | Wheatley et al. |
| 8,754,434 B1 | 6/2014 | Gollier et al. |

(Continued)

FOREIGN PATENT DOCUMENTS

| JP | 2003029654 A | 1/2003 |
| JP | 2007027751 A | 2/2007 |

(Continued)

*Primary Examiner* — Herve-Louis Y Assouman
(74) *Attorney, Agent, or Firm* — Hunton Andrews Kurth LLP

(57) ABSTRACT

A light emitting device includes a light emitting element, a light-transmissive member covering the light emitting element, a fluorescent material contained in the light-transmissive member, and a multilayer film disposed on the light-transmissive member and including alternatively layered two types of films of different refractive indices, in which the two types of films are aggregated nano-particles of $TiO_2$ and aggregated nano-particles of $SiO_2$.

18 Claims, 5 Drawing Sheets

(51) Int. Cl.
   *H01L 21/66* (2006.01)
   *H01L 33/54* (2010.01)
   *H01L 33/62* (2010.01)
   *G02B 5/28* (2006.01)
   *G02B 5/20* (2006.01)

(56) References Cited

U.S. PATENT DOCUMENTS

| | | | |
|---|---|---|---|
| 2001/0026127 A1* | 10/2001 | Yoneda | H01J 1/74 313/506 |
| 2005/0156496 A1 | 7/2005 | Takashima et al. | |
| 2005/0163971 A1* | 7/2005 | Kobayashi | G02B 1/04 428/156 |
| 2005/0207007 A1 | 9/2005 | Shimoda et al. | |
| 2007/0018102 A1 | 1/2007 | Braune et al. | |
| 2007/0100026 A1* | 5/2007 | Munro | C08L 51/003 523/200 |
| 2008/0036943 A1 | 2/2008 | Matsumoto et al. | |
| 2009/0153971 A1* | 6/2009 | Takada | G02B 5/285 359/585 |
| 2009/0161219 A1 | 6/2009 | Ishizawa et al. | |
| 2009/0261366 A1* | 10/2009 | Eisert | H01L 33/50 257/98 |
| 2011/0096560 A1 | 4/2011 | Ryu et al. | |
| 2011/0133218 A1* | 6/2011 | Lee | H01L 33/54 257/88 |
| 2011/0279998 A1* | 11/2011 | Su | H01L 33/46 362/84 |
| 2012/0091490 A1* | 4/2012 | Fujikane | H01L 33/54 257/98 |
| 2013/0121021 A1* | 5/2013 | Lin | G02B 5/0242 362/606 |
| 2014/0252388 A1* | 9/2014 | Kimura | H01L 33/502 257/98 |
| 2015/0028373 A1* | 1/2015 | Abe | H01L 33/56 257/98 |
| 2015/0221836 A1 | 8/2015 | Kurino et al. | |

FOREIGN PATENT DOCUMENTS

| | | |
|---|---|---|
| JP | 2008235827 A | 10/2008 |
| JP | 2008270707 A | 11/2008 |
| JP | 2010074117 A | 4/2010 |
| JP | 2010087324 A | 4/2010 |
| JP | 2011119739 A | 6/2011 |
| JP | 2011198800 A | 10/2011 |
| JP | 2012009696 A | 1/2012 |
| JP | 2013196854 A | 9/2013 |
| JP | 2013213932 A | 10/2013 |
| JP | 2014029928 A | 2/2014 |
| JP | 2014044367 A | 3/2014 |
| JP | 2014508398 A | 4/2014 |
| JP | 2014222705 A | 11/2014 |
| JP | 2015026698 A | 2/2015 |
| JP | 2015043359 A | 3/2015 |
| JP | 2015064391 A | 4/2015 |
| WO | 2012091971 A1 | 7/2012 |
| WO | 2013157310 A1 | 10/2013 |

* cited by examiner

LIGHT EMITTING DEVICE AND METHOD OF MANUFACTURING THE SAME, AND DISPLAY DEVICE

CROSS-REFERENCE TO RELATED PATENT APPLICATION

This is a divisional application of U.S. patent application Ser. No. 15/649,149, filed Jul. 13, 2017, which claims priority under 35 U. S. C. § 119 to Japanese Patent Application No. 2016-138417, filed Jul. 13, 2016. The contents of this application are incorporated herein by reference in their entirety.

BACKGROUND

Technical Field

The present disclosure relates to a light emitting device, a method of manufacturing the light emitting device and a display device.

Description of Related Art

Generally, a light emitting device has a light emitting element such as a light emitting diode (LED) and a light-transmissive resin covering the light emitting element, and further, a fluorescent material to convert wavelength of light from the light emitting element is added in the light-transmissive resin. Light from the fluorescent material and light from the light emitting element are extracted from the light emitting device and mixed light is emitted from the light emitting device. Accordingly, the color of light emitted from the light emitting device is dependent on the colors and emission intensity of light emitted from the light emitting element and the fluorescent material. Therefore, when the emission wavelength of the light emitting element and the amount of the fluorescent material used in the light emitting device have a large shift from respective predetermined values, the resulting color of light extracted from the light emitting device may not meet the requirements.

A light emitting device capable of adjusting emission color is described in Japanese Unexamined Patent Application Publication No. 2015-026698.

Also, a semiconductor light emitting element having an optical filter at a light extraction side of the wavelength converting layer that includes a fluorescent material is described in Japanese Unexamined Patent Application Publication No. 2011-198800.

Also, an LED light emitting device having an LED element to emit ultraviolet light, a light-transmissive sealing member containing fluorescent material particles and sealing an upper surface of the LED element, and a dielectric multilayer film to reflect ultraviolet light onto an upper surface of the light-transmissive sealing member is described in Japanese Unexamined Patent Application Publication No. 2014-222705.

SUMMARY

A light emitting device according to certain embodiments of the present disclosure includes a light emitting element, a light-transmissive member covering the light emitting element and configured to allow light from the light emitting element to pass through, a fluorescent material contained in the light-transmissive member to convert wavelength of light from the light emitting element, and a multilayer film in which two or more types of films of aggregated nano-particles are layered, the multilayer film including a first film of aggregated first nano-particles and a second film of aggregated second nano-particles that has a refractive index different from a refractive index of the first nano-particles.

A method of manufacturing a light emitting device according to certain embodiments of the present disclosure includes; providing a light emitting device, the light emitting device including a light emitting element covered by a light-transmissive member that is configured to allow light from the light emitting element to pass through, and a fluorescent material to convert wavelength of light from the light emitting element, the fluorescent material being contained in the light-transmissive member; and disposing a multilayer film on the light-transmissive member. The step of disposing the multilayer includes, applying a first slurry comprising first nano-particles dispersed in a first solvent on the light-transmissive member to dispose a first film of aggregated first nano-particles; applying a second slurry comprising second nano-particles dispersed in a second solvent on the first film to dispose a second film, the second nano-particles having a refractive index different from a refractive index of the first nano-particles; and repeating the disposing of the first film and the second film to dispose a multilayer film having a predetermined number of layered films.

A light emitting device according to other certain embodiments of the present disclosure includes a light emitting element, a light-transmissive member allowing light from the light emitting element to pass through, a fluorescent material contained in the light-transmissive member to convert wavelength of light from the light emitting element, and a multilayer film disposed on the light-transmissive member. When the peak wavelength of light emitted from the light emitting element is indicated as $\lambda$, at least one film in the multilayer film satisfies $n_1 \cdot d_1 = (2N-1)/4 \cdot \lambda$ (where $d_1$ is the thickness of the film, $n_1$ is the refractive index at the peak wavelength, and N is a natural number), and at least one film in the multilayer film satisfies $n_2 \cdot d_2 = (2N-1)/4 \cdot \lambda$ (where $d_2$ is the thickness of the film, $n_2$ is the refractive index at the peak wavelength, and N is a natural number which is $n_2 \neq n_1$). A light emitting device according to other certain embodiments of the present disclosure includes at least one film in the multilayer film satisfying, when the peak wavelength of light emitted from the light emitting element is indicated as $\lambda'$, $n_1' \cdot d_1' = N/2 \cdot \lambda'$ (where $d_1'$ is the thickness of the film, $n_1'$ is the refractive index at the peak wavelength, and N is a natural number), and at least one film in the multilayer film satisfying $n_2' \cdot d_2' = N/2 \cdot \lambda'$ (where $d_2'$ is the thickness of the film, $n_2'$ is the refractive index at the peak wavelength, and N is a natural number which is $n_2' \neq n_1'$).

A display device according to certain embodiments of the present disclosure includes a lighting device having the light emitting device, and a display panel provided with a color filter having a plurality of color portions at least including portions having a blue color, a green color, and a red color, and configured to display an image by using light from the lighting device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

In the following, certain embodiments will be described with reference to the drawings. The embodiments shown below are intended as illustrative of a light emitting device to give a concrete form to technical ideas of the present invention, and the scope of the present invention is not limited to those described below. Further, the size, material, shape, relative arrangement and the like of constituent components described in the embodiments are not intended to limit the scope of the present invention thereto unless otherwise specified, and they are given as examples. Note that the sizes and the arrangement relationships of the members in each of drawings are occasionally shown exaggerated and shapes may be simplified for ease of explanation.

Light Emitting Device

Figure 1:
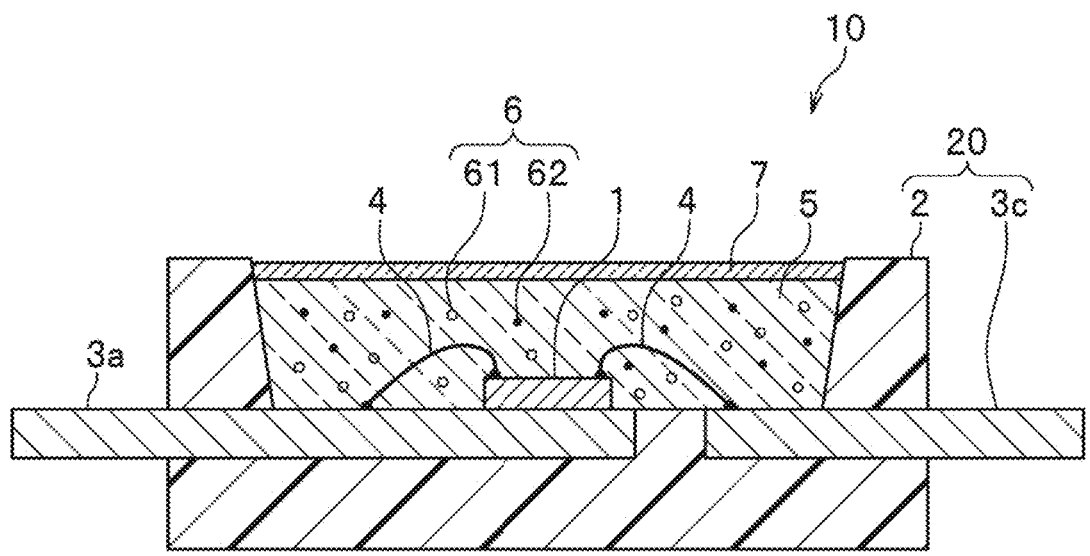
FIG. 1 is a cross-sectional view schematically showing a configuration of a light emitting device according to one embodiment.
Figure 2:
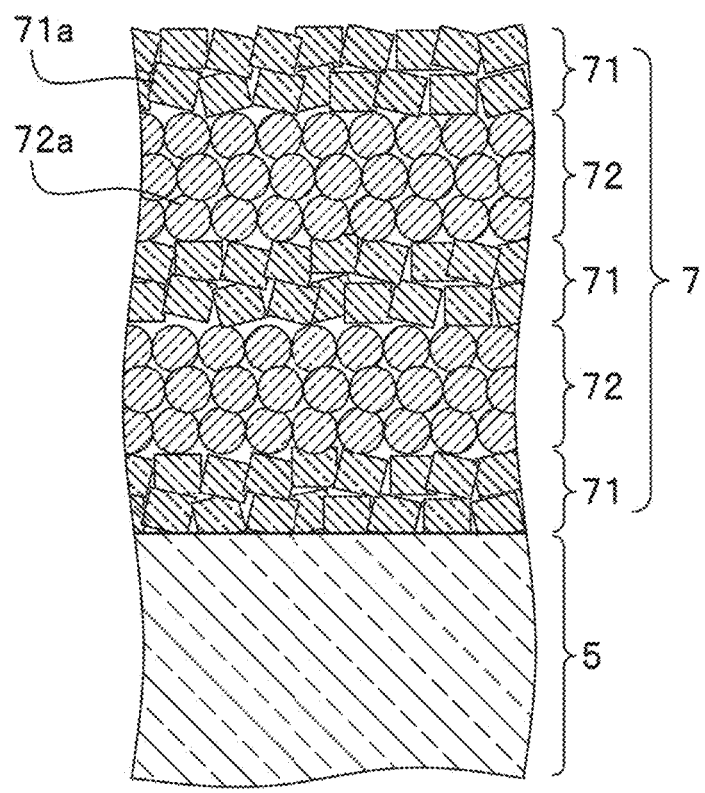
FIG. 2 is a partial cross-sectional view schematically showing a configuration of a multilayer film of the light emitting device according to one embodiment.

A light emitting device according to one embodiment will be described with reference to FIG. 1 and FIG. 2. FIG. 1 is a cross-sectional view schematically showing a configuration of the light emitting device according to one embodiment. FIG. 2 is a partial cross-sectional view schematically showing a configuration of a multilayer film of the light emitting device according to one embodiment. The shapes and particle sizes of the nano-particles 71a and 72a and the number of layers of the nano-particles per single layer of the high refractive index layer 71 and the low refractive index layer 72 shown in FIG. 2 are given as an example.

The light emitting device 10 includes a light emitting element 1, a light-transmissive member 5 covering the light emitting element 1 and configured to allow light from the light emitting element 1 to pass through, a fluorescent material 6 contained in the light-transmissive member 5 to convert wavelength of light from the light emitting element 1, and a multilayer film 7. In the multilayer film 7, two or more types of films of aggregated nano-particles are layered, the films include a high refractive index layer 71 of aggregated first nano-particles 71a and a low refractive index layer 72 of aggregated second nano-particles 72a having a refractive index different from the refractive index of the first nano-particles 71a. The light emitting device 10 further includes a light-reflecting member 2, leads 3a and 3c, and wires 4. In FIG. 1, the light-transmissive member 5 is assumed to be transparent and is depicted without hatching etc. The light emitting device 10 also includes a light-reflecting member 2 that defines a recess provided with an opening, and is configured to emit white light of predetermined color in an upward direction from the opening of the recess. In the present specification, the terms such as "upper" and "lower" are used in the same way as shown in FIG. 1, unless otherwise specified.

Light Emitting Element

The light emitting element 1 serves as a light source in the light emitting device 10, and a single light emitting element 1 is housed in the recess formed with an upward opening in the light-reflecting member 2, and is placed on a lead 3a provided as a part of a bottom surface of the recess. In the present embodiment, the light emitting element 1 is a face-up mounting type, having n-side and p-side electrodes on its upper surface, and the electrodes are electrically connected to the leads 3a and 3c via wires 4, respectively.

The light emitting element 1 is, for example, a light emitting diode (LED) configured to emit light of an appropriate wavelength, and a light emitting element 1 that is configured to emit blue light (wavelength in a range of 430 nm to 475 nm) is preferably used. For such an LED, for example, a nitride-based semiconductor $In_XAl_YGa_{1-X-Y}N$, ($0 \leq X$, $0 \leq Y$, $X+Y<1$) can be used. In the present embodiment, the light emitting element 1 is designed to emit blue light with a peak wavelength $\lambda_0$ of 450 nm, which may produce light having a peak wavelength $\lambda$ equal to the designed value $\lambda_0$ or a value near $\lambda_0$. The light emitting element 1 can have appropriate shape and size according to purpose.

Light-Reflecting Member

The light-reflecting member 2 is an exterior of the light emitting device 10, and also serves as a base to support the light emitting element 1 and the leads 3a and 3c, and as a light-reflector used to efficiently emit light upward. Further, in the manufacturing of the light emitting device 10, the light-reflecting member 2 also serves as a dam at the time of disposing the light-reflecting member 5 and the multilayer film 7. The light-reflecting member 2 has an external shape of an approximately rectangular parallelepiped elongated along an alignment of the leads 3a and 3c, and defines a recess with an upward opening. In addition to the above, the light-reflecting member 2 may be provided with a marking recess for identifying polarity in the light emitting device 10. The recess in the light-reflecting member 2 is formed with a size that can house the light-reflecting member 1 and allows wire bonding of the wires 4, and four lateral surfaces defining the recess are tapered widening upward to reflect light mainly to the upward direction. The light-reflecting member 2 and the leads 3a and 3c are together constitute the package 20, in which the light-reflecting member 2 holds the leads 3a and 3c such that each of the leads 3a and 3b serves as a part of the bottom surface of the recess and also penetrates the light-reflecting member 2 to the outside.

The light-reflecting member 2 is made of an insulating material having strength (hardness) sufficient to serve as the base and allowing to be formed in the shape as described above. More specifically, the sealing member 2 can be formed with a base material of resin such as silicone resin, modified silicone resin, epoxy resin, modified epoxy resin, acrylic resin, or a hybrid resin containing one or more of those resins, and a light-reflecting material added to the base material. Examples of the light-reflecting material include oxides of Ti, Zr, Nb, Al, and Si, and AlN, $MgF_2$, and BN, of those, titanium oxide ($TiO_2$) is preferable.

Lead

The leads 3a and 3c are wirings to supply electric current from the outside of the light emitting device 10 to the light emitting element 1. The lead 3a serves as a positive electrode and is electrically connected to the p-side electrode of the light emitting element 1 via a wire 4. The lead 3c serves as a negative electrode and is electrically connected to the n-side electrode of the light emitting element 1 via another wire 4. The leads 3a and 3c each has a substantially flat-plate shape and held by the light-reflecting member 2 so that the substantially flat surface of the leads 3a and 3b are substantially in parallel to the upper surface of the light emitting device 10. In more detail, the leads 3a and 3c are arranged in a longitudinal direction of the light-reflecting member 2, spaced from each other on the bottom surface of the recess of the light-reflecting member 2 so that portions of the leads 3a and 3c penetrate through and are protruded outside from the light-reflecting member 2, respectively. The lead 3a is arranged longer than the lead 3c at the bottom surface of the recess so that the light emitting element 1 can be placed on the lead 3a. The region on the bottom surface of the recess of the light-reflecting member 2 where the leads 3a and 3c are arranged is indicated as an inner lead portion which is used as a wire bonding region and also constitutes a light-reflecting surface. The portions of the leads 3a and 3c that are protruded outside of the light-reflecting member 2 are indicated as outer-lead portions and are electrically connected to the wirings or the like located outside of the light emitting device 10. In FIG. 1, the outer lead portions of the light emitting device 10 have plate-like shapes and continuous to the inner lead portions, but for example, the outer lead portions may be bent downward along the light-reflecting member 2. The leads 3a and 3c are preferably made of a metal plate of Cu, a Cu alloy, or the like, and further, Ag plating or the like may be applied at least on the upper surfaces of the inner lead portions to obtain good light-reflecting surfaces.

Wire

Wires 4 are electrically conductive wires used to electrically connect the p-side and the n-side electrodes of the light emitting element 1 with the inner lead portions of the leads 3a and 3c, and more specifically, are wires for wire bonding, which are, for example, Au wires.

Light Transmissive Member

The light-transmissive member 5 serves as a sealing member, disposed in the recess of the light-transmissive member 2 to enclose the light emitting element 1 and the wires 4, so as to protect them from external environment. The light-transmissive member 5 also serves as a base for disposing the fluorescent material 6. The light-transmissive member 5 is made of an insulating and light-transmissive material, and a thermosetting resin, for example, silicone resin, epoxy resin, or urea resin may be used.

Fluorescent Material

The fluorescent material 6 is dispersed in the light-transmissive member 5 and can be excited by blue light emitted from the light emitting element 1 and each component of the fluorescent material 6 emits light of a specific wavelength. It is preferable that the fluorescent material 6 can convert light to green light, yellow light, or red light. In order to obtain light of a desired color in combination with blue light, the light emitting device 10 employs one type or two or more types of fluorescent materials. In the present embodiment, two types of fluorescent materials 61 and 62 are employed as the fluorescent material 6. The fluorescent materials 61 and 62 can be excited by blue light emitted by the light emitting element 1, and to emit light; the fluorescent material 61 emits green light (peak wavelength of 540 nm) and the fluorescent material 62 emits red light (peak wavelength 630 nm).

The ratio of the fluorescent materials 61 and 62 and the content, the state of dispersion, and so forth of the fluorescent materials 61 and 62 in the light-transmissive member 5 are designed in combination with the structure of the multilayer film 7 so that the light extracted from the light emitting device 10 has a desired color and light quantity (intensity). The fluorescent materials 61 and 62 are approximately uniformly dispersed in the light-transmissive member 5, but for example, the fluorescent materials 61 and 62 may be dispersed in the light-transmissive member 5 more densely near the light emitting element 1.

Multilayer Film

The multilayer film 7 is disposed on the light-transmissive member 5, in other words, the multilayer film 7 is disposed at the light emitting side of the light emitting device 10, so that a portion of light passed through the light-transmissive member 5 is directed upward to the outside of the light emitting device 10 and other portion of the light is reflected downward to return to the light-transmissive member 5. In the light emitting device 10, the multilayer film 7 is, together with the light-transmissive member 5, provided in the recess of the light-reflecting member 2 and covers an entire of the upper surface of the light-transmissive member 5. The multilayer film 7 serves as a distributed Bragg reflector (DBR) film that selectively and strongly reflect blue light, so that wavelength conversion efficiency of the fluorescent materials 61 and 62 contained in the light-transmissive member 5 can be enhanced.

The multilayer film 7 includes two or more layers of two or more types of films of different refractive indices. When two types of films are employed, the two types of films are alternatively layered, and when three or more types of films are employed, films are layered so that films of the same type or same refractive index are not successively layered. In the present embodiment, the multilayer film 7 is made of two types of films: a high refractive index layer 71 and a low refractive index layer 72, that are alternatively layered, and includes five layers of films 71, 72, 71, 72, and 71 that are successively layered from the bottom at the light-transmissive member 5 side. In the multilayer film 7, the terms "high refractive index" and "low refractive index" used in the high refractive index layer 71 and the low refractive index layer 72 are used as relative terms. In the present specification, the term "refractive index" is a value at the peak wavelength λ of light emitted from the light emitting element 1, unless otherwise specified.

The multilayer film 7 exhibits higher reflectance with greater number of repetition of layering the high refractive index layers 71 and the low refractive index layers 72, that is, greater number of pairs. Further, to some degree, the greater the number of layers in the multilayer film 7, the easier to adjust each reflectance in two or more desired wavelength regions, as described below. Meanwhile, the greater the number of the layers in the multilayer film 7, the greater the thickness, which may increase attenuation of light, which may decrease the light extraction efficiency of the light emitting device 10. The number of pairs in the multilayer film 7 is determined mainly based on the refractive indices $n_1$ and $n_2$ of the high refractive index layer 71 and the low refractive index layer 72 or the like to obtain a desired value of the reflectance for the blue light emitted from the light emitting element 1. Further, the multilayer film 7 has a high refractive index layer 71 as its uppermost layer, which increases the difference in the refractive indices between the ambient air and the light emitting device 10 and thus increases the reflectance of the light at the upper surface of the multilayer film 7. In the light emitting device 10, the high refractive index layer 71 has a refractive index that is sufficiently different from that of the light-transmissive member 5.

The high refractive index layer 71 and the low refractive index layer 72 that constitute the multilayer film 7 are films of aggregated nano-particles 71a and 72a, respectively. In the present specification, the term "nano-particles" refers to particles with particle size in a range of 1 nm to 100 nm. The particle size of the nano-particles 71a and 72b can be measured by using a dynamic light scattering method, a diffusion method, a diffraction method, or the like. Also, a "film of aggregated nano-particles" may be formed by dispersing primary particles of a particle material in a solvent to obtain a slurry and applying the slurry on a component to be coated with the particles, and allowing the primary particles to aggregate in the coating film, as described below. In some cases, secondary particles to be described below may also be mixed in the slurry as well as the primary particles. Further, the term "nano-particles" in the "film of aggregated nano-particles" refers to primary particles or secondary particles formed by densely aggregating plurality of primary particles (aggregated particles) or both the primary particles and the secondary particles. Accordingly, the primary particles preferably have smaller size than the secondary particles that are the nano-particles 71a and 72a in the high refractive index layer 71 and the low refractive index layer 72. The particle size of the primary particles can be measured by using a microscopic observation method, a BET method, or the like. The particle size of the primary particles can be determined as an average value or a mean value and preferably 50 nm or less. The smaller the particle size the higher transparency of the high refractive index layer 71 and the low refractive index layer 72, which allows a decrease in attenuation of propagating light. The primary particles of the particle size 5 nm or greater is preferable in practical use.

In a film of aggregated nano-particles, the closer the volume ratio of the nano-particles in the film (filling rate) to 100%, the closer the properties such as a refractive index to that of the primary particles. In a film of aggregated nano-particles, gaps may present between the nano-particles and substances, for example, resin used as a binder, air, and/or a slight amount of dispersion agent added in the slurry, may be included in the gaps between the nano-particles, and the smaller the filling rate of the nano-particles, the greater the properties of those substances affect. The high refractive index layer 71 preferably contain the nano-particles 71a at a filling rate of 50% or greater, and the resin, air, or the like, described above may also be included in the gaps. For the resin, those exemplified for the light-transmissive member 5 can also be used. Similarly, the low refractive index layer 72 preferably contain the nano-particles 72a at a filling rate of 50% or greater, and the resin, air, or the like, described above may also be included in the gaps between the nano-particles 72a, and particularly, when air is included, the refractive index can be reduced. For example, when gaps including air present in the low refractive index layer 72, the filling rate of the nano-particles 72a in the high refractive index layer 71 disposed on the low refractive index layer 72 is preferably high to a degree so that the primary particles in the slurry do not enter the gaps. In the film of aggregated nano-particles, the filling rate of the nano-particles may be obtained by, for example, measuring the film thickness and calculating from the content of the slurry and the coating amount per unit area. The particle sizes and the filling rates of the nano-particles 71a and 72a in the high refractive index layer 71 and the low refractive index layer 72 can be adjusted by the particle sizes of the primary particles, content of the respective slurry, and the like.

In order to increase the reflectance of light at the multilayer film 7, two films that in contact with each other, namely, the high refractive index layer 71 and the low refractive index layer 72 preferably have a sufficient degree of difference in the refractive indices at the peak wavelength λ of light emitted from the light emitting element. Alternatively, the first nano-particles 71a and the second nano-particles 72a have a sufficient degree of difference in the refractive indices at the peak wavelength λ of light emitted from the light emitting element. More specifically, the difference in the refractive indices is preferably 0.05 or greater, more preferably 0.1 or greater, further preferably 0.2 or greater. The greater the difference, the higher the reflectance at the multilayer film 7. In order to obtain the high refractive index layer 71 and the low refractive index layer 72 as described above, two different types of the materials that have a sufficient difference in the refractive indices may be selected from oxides, fluoride, nitrides of metals for the nano-particles 71a and 72a. For example, for the nano-particles 71a of the high refractive index layer 71, titanium oxide ($TiO_2$), zinc oxide (ZnO), zirconia ($ZrO_2$), alumina ($Al_2O_3$) etc., for the nano-particles 72a of the low refractive index layer 72, silica ($SiO_2$), magnesium fluoride ($MgF_2$) etc., may be used. In the present embodiment, $TiO_2$ for the nano-particles 71a and $SiO_2$ for the nano-particles 72a are respectively employed. As described above, the refractive indices $n_1$ and $n_2$ of the high refractive index layer 71 and the low refractive index layer 72 are affected not only by the refractive indices of $TiO_2$ and $SiO_2$, which are the materials of the nano-particles 71a and 72a, but also by the filling rate etc. Therefore, it is preferable to measure the refractive indices $n_1$ and $n_2$ of samples of the high refractive index layer 71 and the low refractive index layer 72 to obtain desired conditions.

The multilayer film 7 is configured to selectively and strongly reflect blue light emitted by the light emitting element 1. To achieve the above, the high refractive index layer 71 and the low refractive index layer 72 are designed in consideration of the film thicknesses $d_1$ and $d_2$ with the refractive indices $n_1$ and $n_2$, respectively. For example, when the formulas (1) and (2) are satisfied, a maximum intensity of the reflected light having a wavelength λ can be obtained. The film thicknesses $d_1$ and $d_2$ of the high refractive index layer 71 and the low refractive index layer 72 can be measured by observing a cross section of each layer with an electron microscope. In the formulas (1) and (2) shown below, "N" is a natural number which may differ among the layers 71, 72, 71, 72, and 71 of the multilayer film 7. If the high refractive index layer 71 and the low refractive index layer 72 have a large thicknesses, light propagating therein is absorbed by the layers and attenuated, so that a smaller N is preferable. Also, a film of aggregated nano-particles of a large thickness tends to develop a defect such as a fracture, so that a single layer of a thickness exceeding 750 nm is difficult to form. The thicknesses $d_1$ and $d_2$ of the high refractive index layer 71 and the low refractive index layer 72 can be adjusted by the composition of each slurry and a coating amount per unit area.

$$n_1 \cdot d_1 = (2N-1)/4 \cdot \lambda \tag{1}$$

$$n_1 \cdot d_2 = (2N-1)/4 \cdot \lambda \tag{2}$$

It is preferable that the multilayer film 7 efficiently reflects blue light emitted by the light emitting element 1 and also transmits green light and red light that are wavelength converted by the fluorescent materials 61 and 62 with higher intensity. For example, changing the value N in the formulas (1) and (2) to adjust the film thicknesses $d_1$ and $d_2$ of the high refractive index layer 71 and the low refractive index layer 72 so that the product (optical film thicknesses) of the refractive indices $n_1$ and $n_2$ at the peak wavelength $\lambda'$ of the green light or the red light and the thicknesses $d_1$ and $d_2$ respectively satisfy the relationships shown in the formulas (3) and (4) below. Thus, the intensity of the reflected light of the wavelength $\lambda'$ can be minimized. In some cases, satisfying the formulas (1) and (3), and also the formulas (3) and (4) may be difficult, and further, satisfying those formulas with both the light emitted from the two types of the fluorescent materials 61 and 62 may not be practical. For this reason, simulation is preferably used to design the film thicknesses $d_1$ and $d_2$, and the number of the pairs of the high refractive index layer 71 and the low refractive index layer 72 so that desired reflectances can be obtained at the three wavelengths of light: blue light from the light emitting element 1 and green light and red light from the fluorescent materials 61 and 62. The multilayer film 7 having such a structure described above allows passing of much light whose wavelength is converted by the fluorescent materials 61 and 62, in addition to strongly reflecting blue light emitted from the light emitting element 1. Accordingly, the wavelength conversion efficiency can be further improved, which allows a reduction in the content amount of the fluorescent materials 61 and 62, while enhancing the light extraction efficiency of the light emitting device 10.

$$n_1' \cdot d_1 = N/2 \cdot \lambda' \tag{3}$$

$$n_2' \cdot d_2 = N/2 \cdot \lambda' \tag{4}$$

The wavelength "$\lambda$" in the formulas (1) and (2) and simulation is ideally a measured value of the peak wavelength of light emitted by the light emitting element 1 mounted in the light emitting device 10, but may be approximated by a designed value $\lambda_0$ of the peak wavelength of light emitted by the light emitting element 1. Similarly, the wavelength "$\lambda'$" is ideally a measured value of the peak wavelength of light emitted by either the fluorescent material 61 or 62 in the light emitting device 10, but may be approximated by a designed value of the peak wavelength of light emitted by either the fluorescent material 61 or 62. The measured values of those wavelengths can be obtained by measuring during manufacturing the light emitting device 10, as described further below. Meanwhile, the high refractive index layer 71 and the low refractive index layer 72 constituting the multilayer film 7 may each includes a certain degree of in-plane unevenness in the film thickness, and further in the refractive index due to the particle size, the state of aggregation (filling rate), etc., of the nano-particles 71a and 72a. The multilayer film 7 in which the high refractive index layers 71 and the low refractive index layers 72 as described above are layered tends to have a reflectance to the light of the wavelength $\lambda$ smaller than that of the designed value, so that the number of pairs is preferably designed by measuring the reflectance of the samples, rather than by a simulation. The degree of in-plane unevenness in the thickness and the refractive index of the high refractive index layer 71 and the low refractive index layer 72 can be controlled by the particle size of the primary particles in the slurry, the type and content of the solvent and dispersion agent, coating condition, coating amount, and so force, of the respective layers and the degree of about several percent or less to about one percent or less is preferable.

Accordingly, a light emitting device according to other certain embodiments may have a configuration as shown below. A light emitting device includes a light emitting element, a light-transmissive member covering the light emitting element and configured to allow light from the light emitting element to pass through, a fluorescent material contained in the light-transmissive member to convert wavelength of light from the light emitting element, and a multilayer film disposed on the light-transmissive member. When the peak wavelength of light emitted from the light emitting element is indicated as $\lambda$, at least one film in the multilayer film satisfies $n_1 \cdot d_1 = (2N-1)/4 \cdot \lambda$ (where $d_1$ is the thickness of the film, $n_1$ is the refractive index at the peak wavelength, and N is a natural number), and at least one film in the multilayer film satisfies $n_2 \cdot d_2 = (2N-1)/4 \cdot \lambda$ (where $d_2$ is the thickness of the film, $n_2$ is the refractive index at the peak wavelength, and N is a natural number which is $n_2 \neq n_1$). The multilayer film in the light emitting device contains the films having the thicknesses in the ranges shown above. Thus, reflection of the blue light emitted from the light emitting element can be enhanced, allowing an increase of absorption of the blue light in each of the fluorescent materials, which in turn can increase the intensities of the green light emission and the red light emission of the light emitting device. Accordingly, emission from the light emitting element in the green region can be reduced relatively.

Also, a light emitting device according to other certain embodiments may have a configuration as shown below. A light emitting device includes a light emitting element, a light-transmissive member covering the light emitting element and configured to allow light from the light emitting element to pass through, a fluorescent material contained in the light-transmissive member to convert wavelength of light from the light emitting element, and a multilayer film disposed on the light-transmissive member. When the peak wavelength of light emitted from the light emitting element is indicated as $\lambda'$, at least one film in the multilayer film satisfies $n_1' \cdot d_1' = N/2 \cdot \lambda'$ (where $d_1'$ is the thickness of the film, $n_1'$ is the refractive index at the peak wavelength, and N is a natural number), and at least one film in the multilayer film satisfies $n_2' \cdot d_2' = N/2 \cdot'$ (where $d_2'$ is the thickness of the film, $n_2'$ is the refractive index at the peak wavelength, and N is a natural number which is $n_2' \neq n_1'$). The multilayer film in the light emitting device contains the films having the thicknesses in the ranges shown above. Thus, reflection of the green light and red light emitted from the fluorescent materials can be reduced, which in turn can increase the intensities of the green light emission and the red light emission of the light emitting device. Thus, optical intensity in a region between blue color and green color can be reduced.

The light emitting device according to those other certain embodiments preferably has the multilayer film of dielectric multilayer film.

Operation of Light Emitting Device

Figure 3:
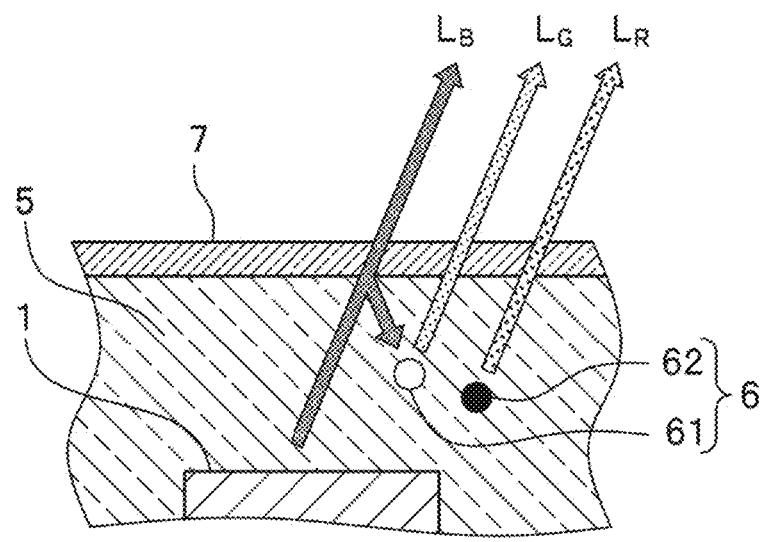
FIG. 3 is a schematic partial cross-sectional view of the light emitting device, schematically illustrating operation of the light emitting device according to one embodiment.

Operation of the light emitting device according to one embodiment will be described with reference to FIG. 1 and FIG. 3. FIG. 3 is a schematic partial cross-sectional view of the light emitting device, schematically illustrating operation of the light emitting device according to one embodiment. In operation of the light emitting device 10, electric current is supplied to the light emitting element 1 from an external power source through the leads 3a and 3c and the wires 4, to cause the light emitting element 1 to emit light. Blue light $L_B$ emitted from the light emitting element 1 propagates in the light-transmissive member 5. While propagating, a portion of the blue light $L_B$ hits the fluorescent material 61 or the fluorescent material 62 dispersed in the light-transmissive member 5 and is converted to green light $L_G$ or Red Light $L_R$. Light from the light emitting element 1 directly or by propagating through the light-transmissive member 5 reaching the surfaces defining the recess of the light-transmissive member 2 or the inner lead portions of the leads 3a and 3b at the bottom surface of the recess is reflected back into the light emitting element 1 or the light-transmissive member 5 and propagates again. The blue light $L_B$, green light $L_G$, and red light $L_R$ that have leached the multilayer film 7 from the upper surface of the light-transmissive member 5 pass through the multilayer film 7 and mixed, and then extracted to the outside of the light emitting device 10 as a white light. At this time, a portion of light, particularly a portion of the blue light $L_B$ is strongly reflected by the multilayer film 7 and returns to the light-transmissive member 5. The light returned in the light-transmissive member 5 propagates again in the light-transmissive member 5, and while propagating, blue light $L_B$ that hits the fluorescent materials 61 and 62 is converted to green light $L_G$ or red light $L_R$. A portion of the converted light may be reflected at the surfaces etc., of the recess of the light-reflecting member 2 and a portion of the converted light passes through the multilayer film 7 and extracted to the outside of the light emitting device 10.

As described above, in the light emitting device 10, repetitive propagation of much of the blue light $L_B$ caused by the multilayer film 7 increases the blue light $L_B$ hitting the fluorescent materials 61 and 62, so that the wavelength conversion efficiency can be increased. Therefore, the higher the reflectance of the blue light LB, that is light of peak wavelength λ, the greater red component (chromaticity coordinate x) and green component (chromaticity coordinate y) in the light, with respect to the blue light, extracted to the outside of the light emitting device 10. Further, the higher the transmittance of the green light $L_G$ and the red light $L_R$ of the multilayer film 7, the further greater red component and green component in the extracted light. In other words, adjusting the reflectance for light of a wavelength λ or further, adjusting transmittance of light of a wavelength λ' of the multilayer film 7 allows for adjusting a shift of chromaticity from the light before reaching the multilayer film 7 to the light extracted to the outside of the light emitting device 10, so that the color of the extracted light can be adjusted to a desired color.

The chromaticity coordinates x, y are used for indication of color characteristic of light, and for example, numerical values based on a chromaticity diagram of the XYZ colorimetric system as defined by the International Commission on Illumination (CIE). The chromaticity can be measured by using a commercially available chromoscope. In other words, in the light emitting device 10, even when the colors of light reaching the multilayer film 7 fluctuate, the multilayer film 7 is designed to reflect light of the wavelength λ at a predetermined reflectance, based on the color of light, so that the fluctuation in the color of light can be corrected. The shifting amount in the chromaticity of light by the multilayer film 7 can be designed based on measuring the chromaticity of light before disposing the multilayer film 7 in the manufacturing of the light emitting device 10, as in the method of manufacturing described below.

Operating Display Device

Figure 4:
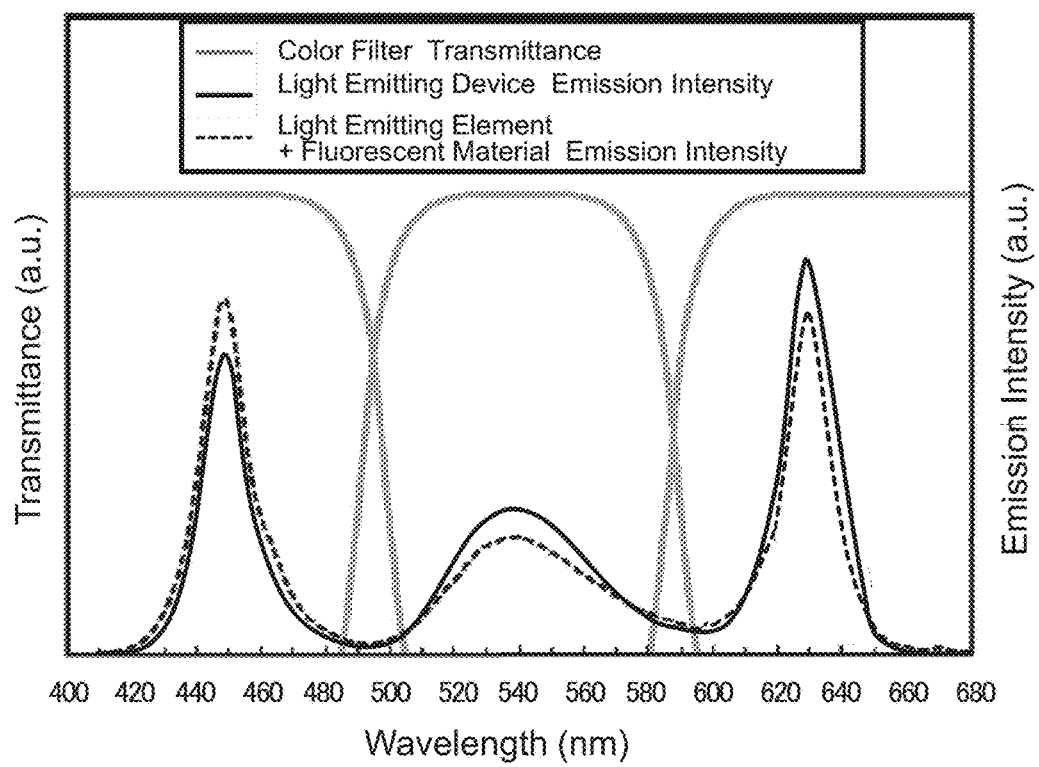
FIG. 4 is a schematic diagram showing matching between the emission spectrum of the light emitting device according to one embodiment and transmission spectra of three different color filters.
Figure 5:
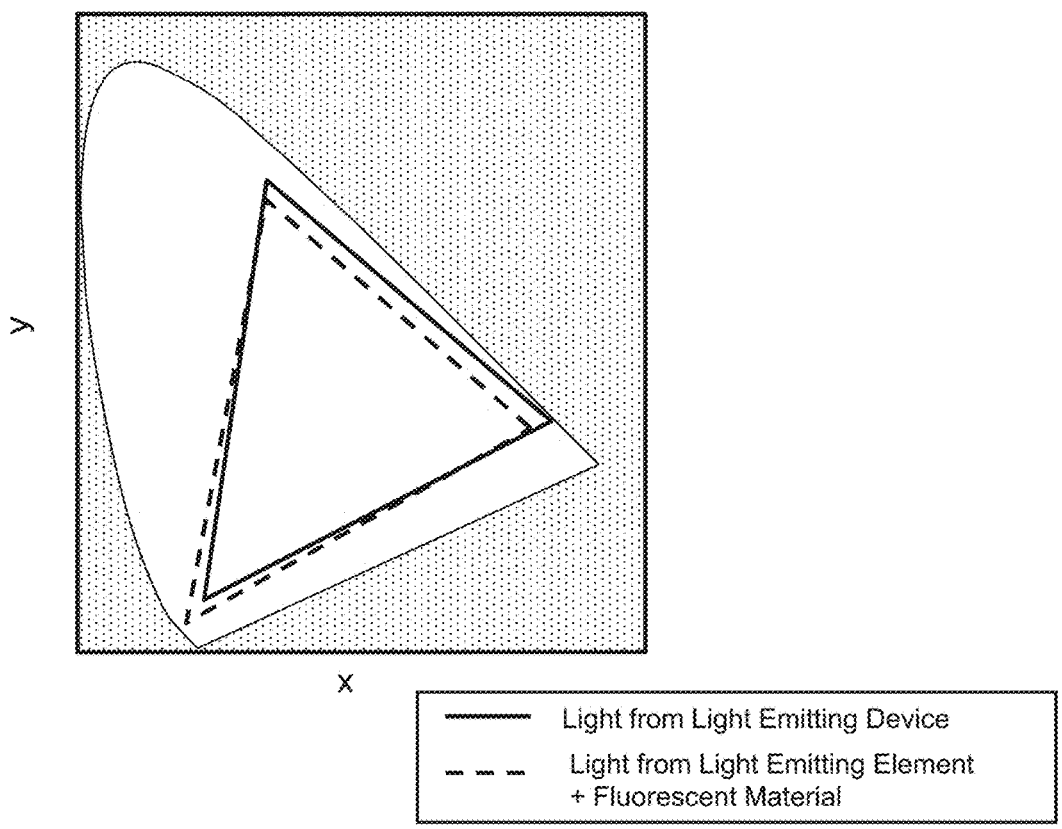
FIG. 5 shows chromaticity coordinates of light from the light emitting device according to one embodiment and light from the light emitting element and the fluorescent material in the light emitting device transmitted through the color filter.

Next, a display device using a combination of the light emitting device according to the present embodiment and a color filter will be described. FIG. 4 is a schematic diagram showing matching between the emission spectrum of the light emitting device according to one embodiment and transmission spectra of three different color filters. FIG. 5 shows chromaticity coordinates of light from the light emitting device according to one embodiment and light from the light emitting element and the fluorescent material in the light emitting device transmitted through the color filters.

The display device includes a lighting device having the light emitting device described above, and a display panel provided with a color filter having a plurality of color portions at least including portions having a blue color, a green color, and a red color, and configured to display an image by using light from the lighting device. More specific examples of the display device include liquid crystal display devices. The lighting device can be a backlight in which the light emitting device may be singly used or a combination of a light guide plate and the light emitting device may be used. Liquid crystal is used for the display panel and a color filter is provided on the display panel. The display device can produce the effects described below.

The liquid crystal display device includes a backlight having the light emitting device 10 and a light guide plate, and a liquid crystal display panel and a color filter are arranged at the light-extraction side of the backlight. The color filter includes a color portion at least including portions having a blue color, a green color, and a red color. A backlight can improve, with provision of a color filter, the purity of red light and green light transmitted through the color filter, allowing for expansion of the color reproduction range of a liquid crystal display device incorporating the backlight. That is, with provision of the multilayer film 7, the emission peak in blue region slightly decreases but the emission peaks in green region and red region increase in the light emitting device 10. Generally, in the liquid crystal display devices, a green region in the color filters also transmits a portion of short wavelength component of blue light from a light emitting element and a portion of long wavelength component of red light from a red fluorescent material as well as green light from a green fluorescent material. Consequently, the color purity of the green light decreases. Whereas, the light emitting device described above has a multilayer film that provides higher intensity of green light relative to blue light and red light in green region, compared to that does not have the multilayer film, which is considered attributable to the improvement in the green color purity. The same is considered in the improvement in the red color purity in red region. Thus, with the use of the light emitting device 10 as the backlight, in combination with a display panel provided with a color filter, a display device that can emit light of deep green and/or deep red can be obtained. Accordingly, a display device having a wider color reproduction range can be provided.

Method of Manufacturing Light Emitting Device

Figure 6:
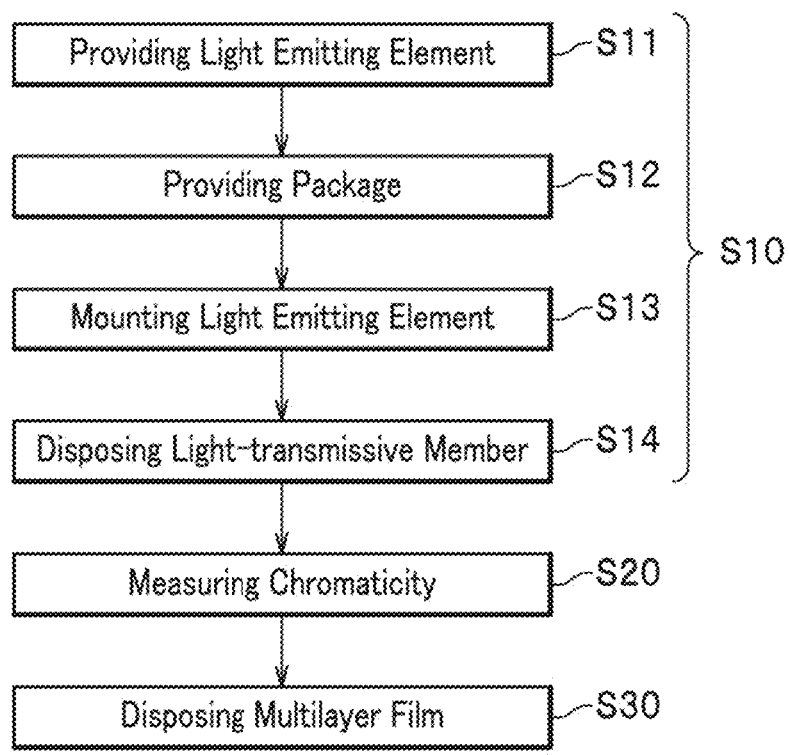
FIG. 6 is a flow chart showing a flow of a method of manufacturing a light emitting device according to one embodiment.

Next, a method of manufacturing the light emitting device according to certain embodiments will be described with reference to FIG. 6. FIG. 6 is a flow chart showing a flow of a method of manufacturing a light emitting device according to one embodiment. The method of manufacturing a light emitting device includes providing a light emitting device (S10), in which a light emitting device having a light emitting element disposed on a light-reflecting member and the light emitting element is covered by a light-transmissive member containing a fluorescent material, and disposing a multilayer film (S30), in which a multilayer film is disposed. In the step of providing the light emitting device (S10), providing a light emitting element (S11) in which a light emitting element is provided, providing a package (S12), in which a light-reflecting member combined with leads is formed to obtain a package, then, mounting the light emitting element (S13) in which the light emitting element is mounted on the package, and disposing a light-transmissive member (S14), in which a light-transmissive member is disposed, are performed in sequence. The step of providing the light emitting element (S11) and the step of providing the package (S12) are performed independently of each other, and may be performed in an appropriate order, or simultaneously. Further, measuring chromaticity (S20) in which the light emitting element is caused to emit light and the chromaticity of light transmitted through the light-transmissive member is measured may be performed before the step of disposing the multilayer film (S30), to obtain the light emitting device.

Providing Light Emitting Element

In the step of providing the light emitting element (S11), the light emitting element 1 is provided. For example, a nitride-based semiconductor is grown on a substrate made of sapphire or the like, where an n-type semiconductor layer, an active layer (light emitting layer), and a p-type semiconductor layer are layered in order. Then, at each predetermined portions, the p-type semiconductor layer and the active layer are removed to expose corresponding portion of the n-type semiconductor layer, and electrodes electrically connecting to the upper surfaces of the n-type semiconductor layer and the p-type semiconductor layer are respectively disposed. Then, the light emitting elements 1 arranged in a matrix on a single substrate are singulated.

Providing Package

In the step of providing the package (S12), the package 20 is provided. A Cu-plate of a predetermined thickness is provided and punching or the like is applied to form shapes of the leads 3a and 3c, then Ag plating is applied to obtain a lead frame having the leads 3a and 3c. Then, using a resin material containing a light-reflecting material, the light-reflecting member 2 with interposing leads 3a and 3c is formed by way of injection molding or the like, to obtain the package 20.

Mounting Light Emitting Element

In the step of mounting the light emitting element (S13), a light emitting element 1 is mounted on the package 20. The lower surface of the light emitting element 1 is fixed via an adhesive or the like, on the lead 3a at the bottom surface of the recess of the light-reflecting member 2. Subsequently, wire-bonding is performed to electrically connect the electrodes of the light emitting element 1 and the inner lead portions of the leads 3a and 3c with the wires 4, respectively.

Disposing Light Transmissive Member

In the step of disposing the light-transmissive member (S14), the light-transmissive member 5 is disposed. Using a dispenser or the like, a predetermined amount of a resin material containing the fluorescent materials 61 and 62 is applied in drops in the recess of the light-reflecting member 2. Then, a processing appropriate to the resin material, such as heating is performed to harden the resin material in the recess to obtain the light-transmissive member 5 containing the fluorescent materials 61 and 62.

Measuring Chromaticity

In the step of measuring chromaticity (S20), a power source is connected to the outer lead portions of the leads 3a and 3c to supply electric current to the light emitting element 1 to cause emission and the chromaticity of light transmitted through the light-transmissive member 5 is measured. From the measured x-value and y-value of the chromaticity of the light, the shift amounts Δx and Δy necessary for obtaining the desired chromaticity for the completed light emitting device 10 are calculated.

Disposing Multilayer Film

In the step of disposing the light-transmissive member (S30), a multilayer film 7 is disposed on the light-transmissive member 5. In the step, slurries for the high refractive index layer 71 and the low refractive index layer 72 are respectively provided. Primary particles of $TiO_2$ and $SiO_2$ are dispersed in a corresponding organic solvent such as toluene, ethanol, or the like to obtain respective slurries. At this time, the primary particles are preferably dispersed uniformly in the respective slurries. Thus, as needed, a pre-treatment such as a surface treatment on the primary particles or adding of a high-molecule-dispersing agent such as an acrylic-based dispersing agent in the slurry may be performed. Then, the obtained two types of the slurries are applied alternatively on the light-transmissive member 5. For applying the slurry, any appropriate method that allows adjusting the coating amount per unit area can be used, and examples thereof include a potting method, an ink-jet method, a spray method, a spin coating method, and a dipping method. In the present embodiment, in a plan view, the sizes of the high refractive index layer 71 and the low refractive index layer 72 are in conformity to the shape of the recess of the light-reflecting member 2, so that appropriate sizes of the layers can be obtained by adjusting the applying amount of the slurry, and in the present embodiment, a potting method is employed and a dispenser or the like can be used as in the step of disposing the light-transmissive member (S14).

An amount of the slurry for the high refractive index layer 71 to obtain a thickness $d_1$ after dried is applied in drops so as to spread on the entire of the light-transmissive member 5 in the recess of the light-transmissive member 2. When the slurry on the light-transmissive member 5 is dried, the primary particles of $TiO_2$ are aggregated while the organic solvent is evaporated, to give a film of aggregated nanoparticles of $TiO_2$. At this time, a drying method such as natural drying, warm air drying, oven drying, or the like may be used. The drying time can be determined according to the drying method, the content and dropping amount of the slurry, and drying time of at least one second to several tens of seconds may be employed so that the slurry will not mix with the slurry applied thereon and not cause a decrease in productivity. Next, in a similar manner, an amount of the slurry for the low refractive index layer 72 to obtain a thickness $d_2$ after dried is applied in drops. Similar operations are repeated and after applying drops for the uppermost layer of the high refractive index layer 71, all the five layers are completely dried by using an oven, blowing warm wind, or by drying naturally to obtain the multilayer film 7.

The multilayer film 7 is preferably designed by determining the reflectance to light of the wavelength λ and the transmittance of light of the wavelength λ' based on the shift amount Δx and Δy of the color of light calculated in the step of measuring chromaticity (S20), and determining the number of the pairs and the film thicknesses $d_1$ and $d_2$ of the high refractive index layer 71 and the low refractive index layer 72. For example, when the x-value and the y-value of the chromaticity of the measured light are smaller than the reference values, the number of the pairs is increased to increase the shift amount of the chromaticity caused by the multilayer film 7. That is, for each of the light emitting devices 10, the thicknesses $d_1$ and $d_2$ of the high refractive index layer 71 and the low refractive index layer 72 can be set according to the chromaticity of the light measured in the step of measuring the chromaticity (S20), and the dropping amount of the slurry and the number of layers can be determined.

Further, the film thickness $d_1$ and $d_2$ of the high refractive index layer 71 and the low refractive index layer 72 may be designed based on the measured values of the peak wavelength $\lambda$ of light emitted by the light emitting element 1 and the peak wavelengths $\lambda'$ of light emitted from the fluorescent materials 61 and 62.

For example, in the step of measuring chromaticity (S20), the emission intensity is also measured in addition to the chromaticity of the light to obtain the peak wavelengths $\lambda$ and $\lambda'$. Alternatively, in the step of providing the light emitting element (S11), before or after singulating the light emitting element 1, or after the step of mounting the light emitting element (S13), the light emitting element 1 may be caused to emit light to measure the peak wavelength $\lambda$ of the light.

In the method of manufacturing the light emitting device according to the present embodiment, the film thickness and the number of the respective layers of the multilayer film can be easily changed for each light emitting device, and even when the wavelength of light emitted from the light emitting element and the content amount of the fluorescent materials fluctuate, light emitting devices that allow extraction of desired color of light can be obtained. Moreover, each film of the multilayer film can be formed in the limited region by potting or the like, so that provision of a mask or the like, becomes unnecessary.

As described above, the light emitting device according to the present embodiment can emit substantially uniform light despite of unevenness in the wavelength of light emitted from the light emitting element or in the content of the fluorescent material, further, high wavelength converting efficiency of the fluorescent material and high light extraction efficiency are realized, and can be manufactured with good productivity.

Variation

The multilayer film 7 may include one or more layers of the high or/and low refractive index layers 71 and 72 adapted to cause Rayleigh scattering of blue light emitted by the light emitting element 1, in this case, this configuration is preferably applied to the lowermost high refractive index layer 71 and the particle size of the nano-particles 71a is accordingly adjusted. The multilayer film 7 may have the low refractive index layer 72 as its lowermost layer, and particularly when there is a large difference between the refractive index of the low refractive index layer 72 and the light-transmissive member 5, a higher reflectance can be obtained. Further, the multilayer film 7 may have a low refractive index layer 72 as its uppermost layer, which reduces the difference in the refractive indices between the light emitting device 10 and the ambient air, which in turn increases the transmittance of light at the upper surface, so that the light extraction efficiency can be increased.

In the light emitting device 10, the upper surface of the light-transmissive member 5 may be arranged approximately co-planar to the upper surface (edge of the upper surface defining the opening of the recess) of the light-reflecting member 2 and the multilayer film 7 may be disposed on the upper surface of the light-transmissive member 5 and the upper surface of the light-reflecting member 2 that is located outward of the light-transmissive member 5. In this configuration, the edge of the light-reflecting member 2 surrounding the opening of the recess of the light-reflecting member 2 is covered by the multilayer film 7 and the strength of the opening edge can be improved. Alternatively, the light emitting device 10 may have the multilayer film 7 disposed so that a portion of the light-transmissive member 5 is exposed, with this, the color of the extracted light can be adjusted by the exposed area of the light-transmissive member 5.

EXAMPLES

Figure 7:
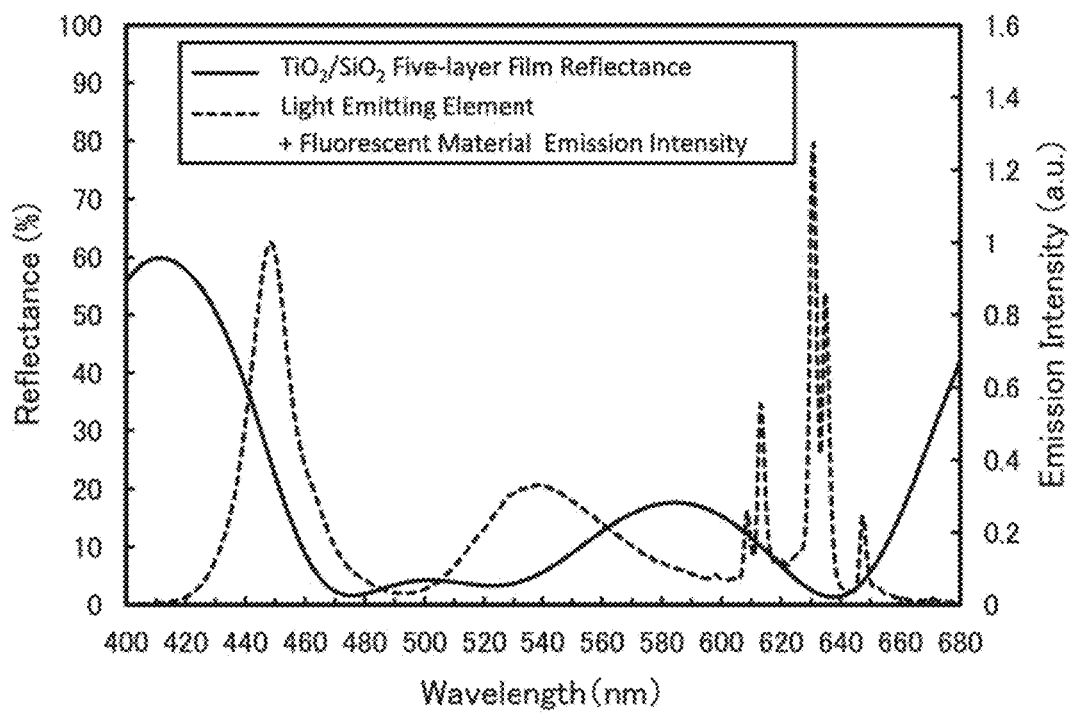
FIG. 7 is a diagram showing a simulation result of a reflection spectrum of five-layer film of $TiO_2/SiO_2$, and an emission spectrum of light from the light emitting element and the fluorescent material of the light emitting device.
Figure 8:
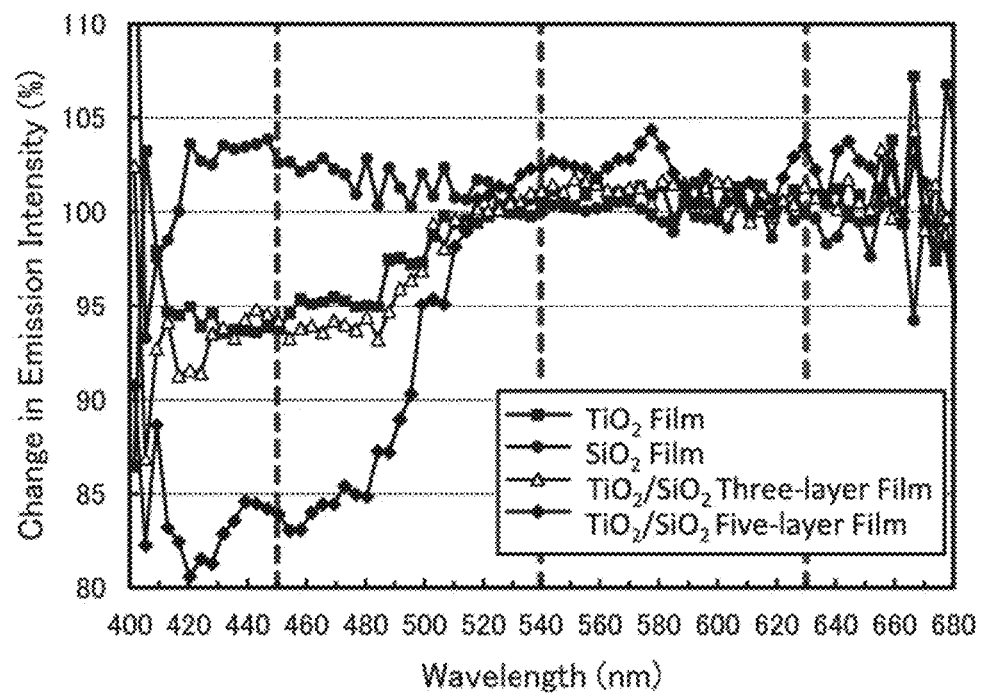
FIG. 8 is a diagram showing ratios of the emission intensities of the light emitting device after disposing a three-layer film or a five-layer film to before disposing respective layered film, in which films of aggregated $TiO_2$ nano-particles and aggregated $SiO_2$ nano-particles are alternately layered.

The examples will be described below. FIG. 7 is a diagram showing a simulation result of a reflection spectrum of five-layer film of $TiO_2/SiO_2$, and an emission spectrum of light from the light emitting element and the fluorescent material of the light emitting device. FIG. 8 is a diagram showing ratios of the emission intensities of the light emitting device after disposing a three-layer film or a five-layer film to before disposing respective layered film, in which films of aggregated $TiO_2$ nano-particles and aggregated $SiO_2$ nano-particles are alternately layered. In Examples, samples of the light emitting devices having a three-layer film or a five-layer film of the multilayer film are provided. In each sample, emission spectrum and chromaticity of light extracted before disposing the multilayer film are measured, and the change in the emission intensity and chromaticity due to the multilayer film The three-layer film has a structure of $TiO_2/SiO_2/TiO_2$ and the five-layer film has a structure of $TiO_2/SiO_2/TiO_2/SiO_2/TiO_2$, respectively layered in order. In order to obtain a high reflectance to blue light and approximately 0% of reflectances to green light and red light, the film thicknesses were determined by simulation, and a thickness of 90 nm for a $TiO_2$ film and a thickness of 130 nm for a $SiO_2$ film were designed. In the simulation, the refractive indices of $TiO_2$ film and the $SiO_2$ film are 2.70 and 1.46, respectively, the light-transmissive member under the multilayer film is silicone with the refractive index of 1.53, and the refractive index of the ambient air is 1.0, and no-change in the wavelength is assumed, and a reflection spectrum was obtained.

In each of the light emitting device samples, an LED configured to emit light of 450 nm was used as the light emitting element. The light emitting element was mounted in a package for a side-view type light emitting device, then, a light-transmissive silicone resin having a fluorescent material contained therein was applied to seal the light emitting element, and a light-transmissive member was formed. For the fluorescent material, two types of fluorescent materials: $Si_{6-z}Al_zO_zN_{8-z}$:Eu (β-sialon-based fluorescent material) for green light (peak wavelength 540 nm) and $K_2SiF_6$:Mn (KSF fluorescent material) for red light (peak wavelength 630 nm) were used. In this state where the light-transmissive member was formed, electric current was supplied to the light emitting element to cause the light emitting element to emit light, and the emission spectrum and the chromaticity were measured. Further, the multilayer film was disposed on the light-transmissive member, as described below, to obtain a sample of the light emitting device.

Slurry to form the $TiO_2$ film and the $SiO_2$ film were prepared respectively. Toluene was used as the solvent and 0.5 wt % of $TiO_2$ particles of average particle size 30 nm together with 0.2 wt % of a dispersion agent were dispersed in toluene. Ethanol was used as the solvent and 0.5 wt % of $SiO_2$ particles of average particle size 25 nm together with 0.2 wt % of a dispersion agent were dispersed in ethanol.

The slurry dispersed with $TiO_2$ particles was discharged on the light-transmissive member from a nozzle of 100 μm diameter of a jet dispenser, at 0.7 mm intervals with an amount calculated based on the particle concentration to obtain a thickness of 90 nm. Then, the slurry was left stand for about 10 seconds to be naturally dried to form a film of aggregated $TiO_2$ nano-particles on the light-transmissive member. On the obtained film, the slurry dispersed with $SiO_2$ particles was applied in a same manner as described above, with a calculated amount to obtain a thickness of 130 nm, then, naturally dried to form a film of aggregated $SiO_2$ nano-particles. Those operations were alternately repeated to dispose three-layer film ($TiO_2/SiO_2/TiO_2$) or five-layer film ($TiO_2/SiO_2/TiO_2$i $O_2/SiO_2/TiO_2$) of $TiO_2$ and $SiO_2$, then dried in an oven at 110° C., for 120 minutes to form the multilayer film, thus obtained the samples of the light emitting devices. Also, as reference examples, samples of light emitting devices having a single layer of $SiO_2$ film or a $TiO_2$ film on the light-transmissive member were formed.

The light emitting element in each of the obtained samples was caused to emit light and the emission spectrum and chromaticity were measured. The ratios of the emission intensities at different wavelengths and the shift in chromaticity respectively to those before disposing the multilayer film were calculated. The ratios of the change in the emission intensities are shown with respect to 100% when no change occurred.

TABLE 1

| Film Structure | Change in Emission Intensity, % | | | Change in Color Reproduction Range, % | Shift in Chromaticity | |
| --- | --- | --- | --- | --- | --- | --- |
| | 450 nm | 540 nm | 630 nm | | Δx | Δy |
| $SiO_2$ | 102.06 | 100.60 | 99.94 | 99.9 | −0.0028 | −0.0034 |
| $TiO_2$ | 93.77 | 100.08 | 99.94 | 100.4 | +0.0045 | +0.0084 |
| $TiO_2/SiO_2/TiO_2$ | 94.20 | 101.10 | 101.35 | 100.5 | +0.0054 | +0.0096 |
| $TiO_2/SiO_2/TiO_2/SiO_2/TiO_2$ | 83.92 | 102.32 | 103.50 | 101.3 | +0.0140 | +0.0249 |

With the multilayer film, the light emitting devices each exhibited a decrease in the emission intensity near the wavelength of 450 nm, and an increase in the emission intensity in two wavelength ranges near 540 nm and near 630 nm, and further, the greater the number of the layered films, the greater the ratios of the change. As a result, the chromaticity coordinates x, y of the light showed sifts to + directions, and further, greater shifts were confirmed with the five-layer film. The wavelength range where the emission intensity decreases with the multilayer film approximately conforms to the maximal value of the reflection spectrum of the five-layer film obtained by simulation. In simulation, the reflectance changes in a crest shape with a peak at 410 nm, whereas in the samples, either with the three-layer film or the five-layer film, the emission intensity exhibited a decrease in an approximately flat shape in a wide wavelength range of 420 nm to 480 nm. The sample with a $TiO_2$ single-layer film also exhibited a reduction in the emission intensity in the wavelength range of 420 nm to 480 nm. This is thought to be due to a certain degree of in-plane unevenness in the thickness that each of the films of the aggregated nano-particles of $TiO_2$ or $SiO_2$ may have. The difference of those with the high reflectance wavelength range obtained by the simulation is assumed due to error in the thickness of the samples. Moreover, the decrease in the emission intensity near the wavelength of 450 nm whereas the increase in the emission intensity near the wavelength of 540 nm and near the wavelength of the 630 nm indicate that the multilayer film strongly reflects blue light near the wavelength of 450 nm and that improve the wavelength conversion efficiency of the fluorescent material. Further, the result indicates that the multilayer film has a high transmittance to the wavelength range of light from the fluorescent material, which approximately agrees with the minimum value of the reflection spectrum of the five-layer film obtained by the simulation.

On the other hand, the light emitting device provided with the $TiO_2$ single film exhibited approximately no change in the emission intensity near the wavelength of 450 nm and near the wavelength of 630 nm. This is assumed that despite of an improvement in the wavelength conversion efficiency by high reflectance of blue light, the $TiO_2$ single film also reflects the wavelength-converted green light and red light and that offset the effects. Thus, the shift in the chromaticity of the light was smaller than that of the light emitting device provided with the three-layer film. Meanwhile, the light emitting device provided with the $SiO_2$ single film exhibited a shift in the chromaticity of the light in one direction. This is because the $SiO_2$ single film has a refractive index smaller than that of the silicone of the light-transmissive member under it and also the difference in the refractive indices is smaller, and thus the transmittance of the blue light is increased. Moreover, the area of color reproduction range can be increased with a three-layer film and a five-layer film compared to that obtained with the $SiO_2$ single-layer film. This is due to an expansion of the color reproduction range of green and red.

As described above, the multilayer film of layered film of aggregated nano-particles was confirmed to cause shift in chromaticity of light with either three-layer film or five-layer film, where the five-layer film exhibited greater shift. Further, with those films, a stable, higher reflectance was confirmed in a wide wavelength range.

As shown in the above, a light emitting device and a method of manufacturing the light emitting device are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

The light emitting device according to the embodiments of the present disclosure can be used as a light emitting device that can employ various types of light emitting elements including a semiconductor light emitting element such as a light emitting diode as its light source. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device comprising:
   providing a light emitting device, the light emitting device comprising a light emitting element covered by a light-transmissive member that is configured to allow light from the light emitting element to pass through, and a fluorescent material to convert wavelength of light from the light emitting element, the fluorescent material being contained in the light-transmissive member; and
   disposing a multilayer film on the light-transmissive member, comprising:
     applying a first slurry comprising first nano-particles having a first refractive index and dispersed in a first solvent on the light-transmissive member to dispose a first film of aggregated first nano-particles on the light-transmissive member;
     applying a second slurry comprising second nano-particles dispersed in a second solvent on the first film to dispose a second film of aggregated second nano-particles on the first film, the second nano-particles having a second refractive index being smaller than the first refractive index of the first nano-particles;
     repeating the disposing of the first film and the second film to dispose the multilayer film having a predetermined number of layered films on the light-transmissive member and having the first film as its uppermost layer.

2. The method of manufacturing a light emitting device according to claim 1,
   wherein in the step of disposing the multilayer film, after applying the first slurry, the first solvent is removed to form the first film.

3. The method of manufacturing a light emitting device according to claim 1, wherein in the step of disposing the multilayer film, after applying the second slurry, the second solvent is removed to form the second film.

4. The method of manufacturing a light emitting device according to claim 1,
   wherein in the step of disposing the multilayer film, the first slurry and the second slurry are applied by using a potting method.

5. The method of manufacturing a light emitting device according to claim 1,
   wherein the first film and the second film of the multilayer film each have a thickness of 750 nm or less.

6. The method of manufacturing a light emitting device according to claim 1,
   wherein the first nano-particles of the first film and the second nano-particles of the second film have particle sizes from 5 nm to 100 nm inclusive.

7. The method of manufacturing a light emitting device according to claim 1,
   wherein a volume ratio of the first nano-particles relative to the first film is 50% or more.

8. The method of manufacturing a light emitting device according to claim 1,
   wherein a volume ratio of the second nano-particles relative to the second film is 50% or more.

9. The method of manufacturing a light emitting device according to claim 1,
   wherein a refractive index of the first film is greater than a refractive index of the second film at a peak wavelength of light emitted from the light emitting element.

10. The method of manufacturing a light emitting device according to claim 1,
    wherein the first film of the multilayer film is disposed adjacent to the light-transmissive member and the second film is disposed on the first film.

11. The method of manufacturing a light emitting device according to claim 1,
    wherein the first nano-particles are $TiO_2$ and the second nano-particles are $SiO_2$.

12. The method of manufacturing a light emitting device according to claim 1,
    wherein the light emitting element is configured to emit blue light,
    wherein the fluorescent material includes at least one of a fluorescent material to convert the blue light to green light, a fluorescent material to convert the blue light to yellow light, and a fluorescent material to convert the blue light to red light.

13. The method of manufacturing a light emitting device according to claim 1,
    wherein the multilayer film includes five layers.

14. The method of manufacturing a light emitting device according to claim 1,
    wherein the first film has a different thickness from the second film.

15. The method of manufacturing a light emitting device according to claim 1,
    wherein the second film has a larger thickness than the first film.

16. A method of manufacturing a light emitting device comprising:
    providing a light emitting device, the light emitting device comprising a light emitting element covered by a light-transmissive member that is configured to allow light from the light emitting element to pass through, and a fluorescent material to convert wavelength of light from the light emitting element, the fluorescent material being contained in the light-transmissive member;
    disposing a multilayer film on the light-transmissive member, comprising:
      applying a first slurry comprising first nano-particles having a first refractive index and dispersed in a first solvent on the light-transmissive member to dispose a first film of aggregated first nano-particles on the light-transmissive member;
      applying a second slurry comprising second nano-particles dispersed in a second solvent on the first film to dispose a second film of aggregated second nano-particles on the first film, the second nano-particles having a second refractive index different from the first refractive index of the first nano-particles; and
      repeating the disposing of the first film and the second film to dispose the multilayer film having a predetermined number of layered films on the light-transmissive member;
    before the step of disposing the multilayer film, causing the light emitting element to emit light and measuring chromaticity of the emitted light; and
    in the step of disposing the multilayer film, determining a number of the first films and the second films to be layered or determining a thickness of at least one film of the first films and the second films, based on the chromaticity.

17. A method of manufacturing a light emitting device comprising:
providing a light emitting device, the light emitting device comprising a light emitting element covered by a light-transmissive member that is configured to allow light from the light emitting element to pass through, and a fluorescent material to convert wavelength of light from the light emitting element, the fluorescent material being contained in the light-transmissive member; and
disposing a multilayer film on the light-transmissive member, comprising:
applying a first slurry comprising first nano-particles having a first refractive index and dispersed in a first solvent on the light-transmissive member to dispose a first film of aggregated first nano-particles on the light-transmissive member;
applying a second slurry comprising second nano-particles dispersed in a second solvent on the first film to dispose a second film of aggregated second nano-particles on the first film, the second nano-particles having a second refractive index different from the first refractive index of the first nano-particles; and
repeating the disposing of the first film and the second film to dispose the multilayer film having a predetermined number of layered films on the light-transmissive member and having the first film as its uppermost layer,
wherein in the step of disposing the multilayer film, after applying the first slurry, the first solvent is removed to form the first film, and
wherein a volume ratio of the first nano-particles relative to the first film is 50% or more.

18. A method of manufacturing a light emitting device comprising:
providing a light emitting device, the light emitting device comprising a light emitting element covered by a light-transmissive member that is configured to allow light from the light emitting element to pass through, and a fluorescent material to convert wavelength of light from the light emitting element, the fluorescent material being contained in the light-transmissive member; and
disposing a multilayer film on the light-transmissive member, comprising:
applying a first slurry comprising first nano-particles having a first refractive index and dispersed in a first solvent on the light-transmissive member to dispose a first film of aggregated first nano-particles on the light-transmissive member;
applying a second slurry comprising second nano-particles dispersed in a second solvent on the first film to dispose a second film of aggregated second nano-particles on the first film, the second nano-particles having a second refractive index different from the first refractive index of the first nano-particles; and
repeating the disposing of the first film and the second film to dispose the multilayer film having a predetermined number of layered films on the light-transmissive member and having the first film as its uppermost layer,
wherein in the step of disposing the multilayer film, after applying the second slurry, the second solvent is removed to form the second film, and
wherein a volume ratio of the second nano-particles relative to the second film is 50% or more.

* * * * *